(12) United States Patent
Kandatsu

(10) Patent No.: US 8,378,316 B2
(45) Date of Patent: Feb. 19, 2013

(54) WAFER TEMPERATURE CORRECTION SYSTEM FOR ION IMPLANTATION DEVICE

(75) Inventor: Kazuhiro Kandatsu, Tsukuba (JP)

(73) Assignee: Texas Instruments Incorporated, Dallas, TX (US)

( * ) Notice: Subject to any disclaimer, the term of this patent is extended or adjusted under 35 U.S.C. 154(b) by 35 days.

(21) Appl. No.: 12/815,965

(22) Filed: Jun. 15, 2010

(65) Prior Publication Data

US 2010/0330709 A1 Dec. 30, 2010

(30) Foreign Application Priority Data

Jun. 24, 2009 (JP) .................................. 2009-150084

(51) Int. Cl.
*G21G 5/00* (2006.01)

(52) U.S. Cl. ................. 250/492.1; 250/492.2; 250/492.3

(58) Field of Classification Search ..... 250/492.1–492.3
See application file for complete search history.

(56) References Cited

U.S. PATENT DOCUMENTS

| | | | | |
|---|---|---|---|---|
| 5,440,132 A | * | 8/1995 | Joyner et al. ............. | 250/492.21 |
| 2006/0289795 A1 | * | 12/2006 | Dubois et al. ............. | 250/492.1 |
| 2008/0042078 A1 | * | 2/2008 | England et al. .......... | 250/492.21 |
| 2008/0044938 A1 | * | 2/2008 | England et al. ................. | 438/51 |
| 2011/0207308 A1 | * | 8/2011 | England et al. ............... | 438/514 |

FOREIGN PATENT DOCUMENTS

| JP | 1997-213258 A | 8/1997 |
|---|---|---|
| JP | 2009-87603 A | 4/2009 |

* cited by examiner

*Primary Examiner* — Michael Maskell
(74) *Attorney, Agent, or Firm* — Jacqueline J. Garner; Wade J. Brady, III; Frederick J. Telecky, Jr.

(57) ABSTRACT

To provide an ion implantation device capable of correcting the temperature of the wafer. The ion implantation device of the present invention has: an irradiation means that radiates ions; a retention means that includes a disk 112 that retains at least one wafer W; a thermopile 122 that detects, in a non-contact manner, temperature information for a wafer W retained on disk 112; a cooling medium supply unit that enables heat exchange for a wafer W retained on disk 112; and a control unit that calculates the surface temperature of a wafer W retained on disk 112 based on the temperature information detected by thermopile 122 and that determines whether the calculated surface temperature for the wafer is within a permissible temperature range.

20 Claims, 8 Drawing Sheets

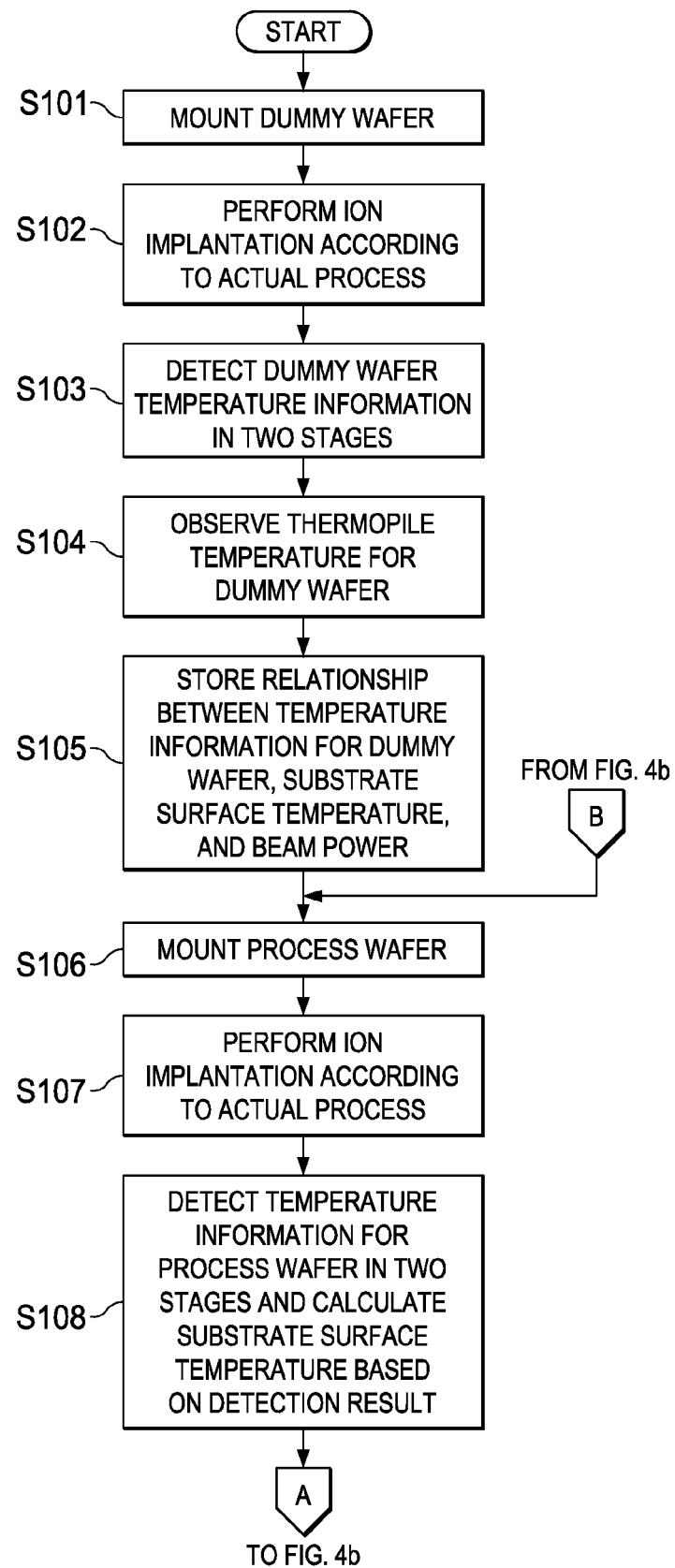

| ION IMPLANTATION CONDITIONS | BEAM POWER | THERMOPILE | THERMO LABEL |
|---|---|---|---|
| Ar 9.9mA 120Kev 2.0e15 | 1200 | 1.557 | 40 |
| Ar 9.9mA 120Kev 2.0e15 | 1700 | 1.575 | 49 |
| Ar 9.9mA 120Kev 2.0e15 | 1770 | 1.575 | 49 |
| Ar 14.5mA 120Kev 2.5e15 | 2200 | 1.593 | 54 |
| Ar 14.5mA 120Kev 2.5e15 | 2450 | 1.598 | 60 |
| Ar 14.5mA 120Kev 2.5e15 | 3420 | 1.632 | 71 |
| - | - | - | - |
FIG. 5
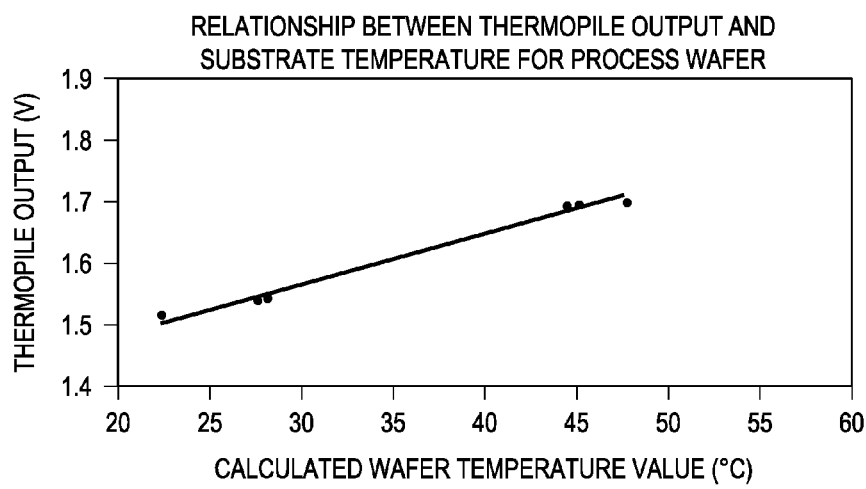
FIG. 7
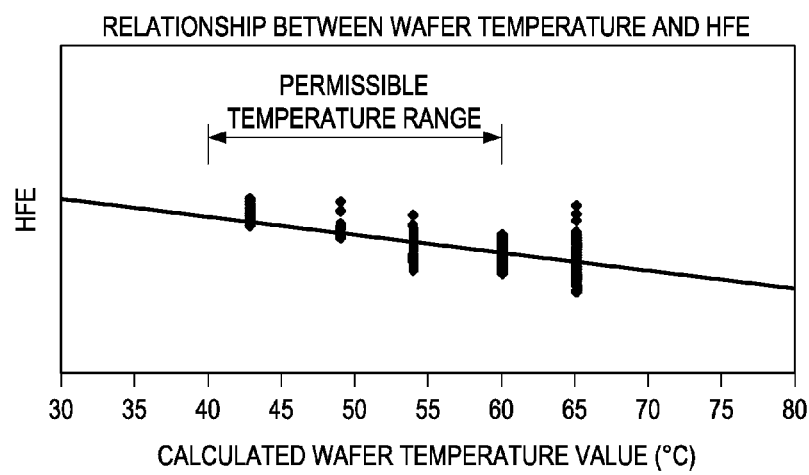
FIG. 8

WAFER TEMPERATURE CORRECTION SYSTEM FOR ION IMPLANTATION DEVICE

FIELD OF THE INVENTION

The present invention pertains to an ion implantation device; in particular, it pertains to a system which corrects the temperature of a wafer in an ion implantation device.

BACKGROUND OF THE INVENTION

Ion implantation is implemented in various steps in the semiconductor manufacturing process; for example, it is implemented during formation of the diffusion region of the source/drain of a MOS transistor and in the formation of a polysilicon gate electrode. For example, Japanese Kokai Patent Application No. Hei 9[1997]-213258 discloses a large current ion implantation device which can increase the beam current without degrading the device characteristics. Furthermore, Japanese Kokai Patent Application No. 2009-87603 discloses an ion implantation device which is capable of controlling the amount of ion implantation very precisely even when the divergence angle or the beam gradient of the ion beam changes.

Methods for processing wafers with an ion implantation device can be broadly classified as a batch method or a single-substrate method. FIG. 1(a) shows an overview of a batch-type ion implantation device; FIG. 1(b) shows an overview of a single-substrate type ion implantation device. As shown in FIG. 1(a), a batch-type ion implantation device has a disk 1 on which are formed pedestals that respectively retain multiple wafers W which have been transported thereto. Disk 1 is rotated at a high speed of, for example, 1200 rpm and disk 1 is scanned mechanically in the vertical direction V, according to the amount of an ion beam B with which it is to be irradiated, from a more or less perpendicular or at an oblique angle with respect to disk 1, thus performing ion implantation of the wafers W. This method is primarily employed with high-current implantation devices. In particular, with a high-current process the wafers W are exposed to extremely high temperature, so that the wafers W must be cooled or the resist pattern formed on the wafers will be deformed by the heat, causing degradation of or variation in the device characteristics. Therefore, disk 1 is connected to a heat exchanger 3 via pipes 2A, 2B; water that is heated by disk 1 passes through pipe 2A and is cooled by heat exchanger 3, and cooled water is supplied to disk 1 through pipe 2B to cool wafers W. In addition, a chiller capable of temperature adjustment can be used in place of a heat exchanger.

Furthermore, as shown in FIG. 1(b), a single-substrate ion implantation device has a platen 4 that supports a wafer W. With respect to wafer W retained on platen 4, ion implantation of said wafer W is performed by a scanning beam B that scans in the horizontal direction H and by mechanically controlling the scan in the vertical direction V of scanning beam B and platen 4. This method primarily is employed with medium-current implantation devices. As with the aforementioned disk, platen 4 is connected to a heat exchanger 3 via pipes 2A, 2B, and the wafer retained on platen 4 is cooled by cooling water or a gas.

For both the batch-type and the single-substrate type methods shown in FIG. 1(a) and (b), the temperature (the heat exchange efficiency) of a wafer W is a critical factor in the functioning of the implantation device, but the ion implantation device is not provided with a system to continuously monitor the wafer temperature. With both the batch processing method and the single-substrate processing method the pedestal and the wafer W are tightly adhered, or the platen and the wafer W are tightly adhered, and a basic premise is that heat exchange takes place normally between them. However, cooling systems these become completely ineffective when the pedestal or platen deteriorates or when contaminants or particles adhere to the pedestal or platen, causing wafer contact defects and resulting in an insufficient heat exchange, and in some cases the occurrence of a large number of product defects may not be noticed for a long time.

SUMMARY OF THE INVENTION

The present invention solves the aforementioned problem of the prior art, and its objective is to provide an ion implantation device with which the wafer temperature can be continuously monitored and corrected.

The ion implantation device according to the present invention is a device that implants ions in a substrate and that has: an irradiation means that radiates ions; a retention means that retains at least one substrate; a detection means that detects, in a noncontact state, temperature information pertaining to the temperature of a substrate retained by the aforementioned retention means; a supply means that supplies a cooling medium to the aforementioned retention means to enable heat exchange for the substrate retained by the aforementioned retention means; and a control means that calculates the surface temperature of the substrate retained by the aforementioned retention means based on the temperature information detected by the aforementioned detection means and determines whether the calculated substrate surface temperature is within a permissible temperature range.

Preferably, the aforementioned control means halts the radiation of ions by the aforementioned irradiation means when it is determined that the aforementioned calculated substrate surface temperature is outside of the aforementioned permissible temperature range. Preferably, the aforementioned permissible temperature range is a temperature range permitted with the ion implantation process, and the aforementioned control means records information related to the permissible temperature range in a memory. Preferably, the aforementioned control means controls the aforementioned supply means based on the aforementioned calculated substrate surface temperature. Preferably, the aforementioned control means controls at least one of: the temperature of the cooling medium or the amount of cooling medium supplied by the aforementioned supply means. Preferably, the aforementioned control means records in a memory a correlation between the temperature information for a dummy silicon substrate and the surface temperature thereof, and the aforementioned control means calculates the surface temperature of a process silicon substrate based on the temperature information for the process silicon substrate and the aforementioned relational expression. Preferably, the aforementioned detection means includes an infrared sensor and the aforementioned temperature information is a voltage generated by the aforementioned infrared sensor according to the heat radiated from the substrate. Preferably, the surface temperature of the dummy silicon substrate included in the aforementioned correlation is a value observed on a thermo label attached to the surface of a dummy silicon substrate. Preferably, the aforementioned retention means includes a rotatable disk that retains multiple substrates and is used for batch processing, and the aforementioned disk exchanges heat by means of a cooling medium supplied by the aforementioned supply means. Preferably, the aforementioned retention means includes a retention member that retains one substrate and is used for single-substrate processing, and the aforementioned retention member exchanges heat by means of a cooling medium supplied by the aforementioned supply means.

The method of the present invention for correcting the temperature of a substrate in an ion implantation device includes steps wherein: a dummy silicon substrate on which is attached a thermo label for the purpose of monitoring the substrate surface temperature is retained by a retention member; the temperature information for the dummy silicon substrate is detected when ion implantation is performed on the dummy silicon substrate, and the substrate surface temperature is monitored based on the aforementioned thermo label; the relationship between the temperature information for the aforementioned dummy silicon substrate and the observed substrate surface temperature is recorded; next, the temperature information for an actual process silicon substrate is detected when ion implantation will be performed or is being performed on the process silicon substrate; the surface temperature of the process silicon substrate is calculated based on the detected temperature information and the aforementioned recorded relationship; and it is determined whether the calculated surface temperature is within a permissible temperature range.

Preferably, the temperature correction method further includes a step wherein implantation of ions in the process silicon substrate is halted when the aforementioned calculated surface temperature is outside of the aforementioned permissible temperature range. Preferably, the temperature correction method further includes a step wherein an alert is provided when the aforementioned calculated surface temperature is outside of the aforementioned permissible temperature range. Preferably, the temperature correction method controls the temperature of the aforementioned retention member based on the aforementioned calculated surface temperature and corrects the surface temperature of the process silicon substrate such that the surface temperature of the process silicon substrate is within the permissible temperature range. Preferably, the temperature correction method further includes a step wherein the calculated surface temperature of the process silicon substrate is displayed on a display in real time.

BRIEF DESCRIPTION OF THE DRAWINGS

FIG. 1—FIG. 1(a) shows an overview of a conventional batch type of ion implantation device.

FIG. 3—FIG. 3(a) is a plan view of the disk of the wafer retention member.

FIG. 4A is a diagram showing the process flow of an ion implantation device according to the first embodiment of the present invention.

FIG. 5 is a table showing the relationship between a thermopile output voltage substrate surface temperature, and beam power when sampling with a dummy wafer.

FIG. 7 is a graph showing the relationship between the thermopile output voltage detected with a process wafer and the calculated substrate surface temperature.

FIG. 8 is a diagram which explains the variation in the ion implantation temperature and the amplification characteristic of a transistor of a device.

REFERENCE NUMERALS AND SYMBOLS AS SHOWN IN THE DRAWINGS

Figure 10:
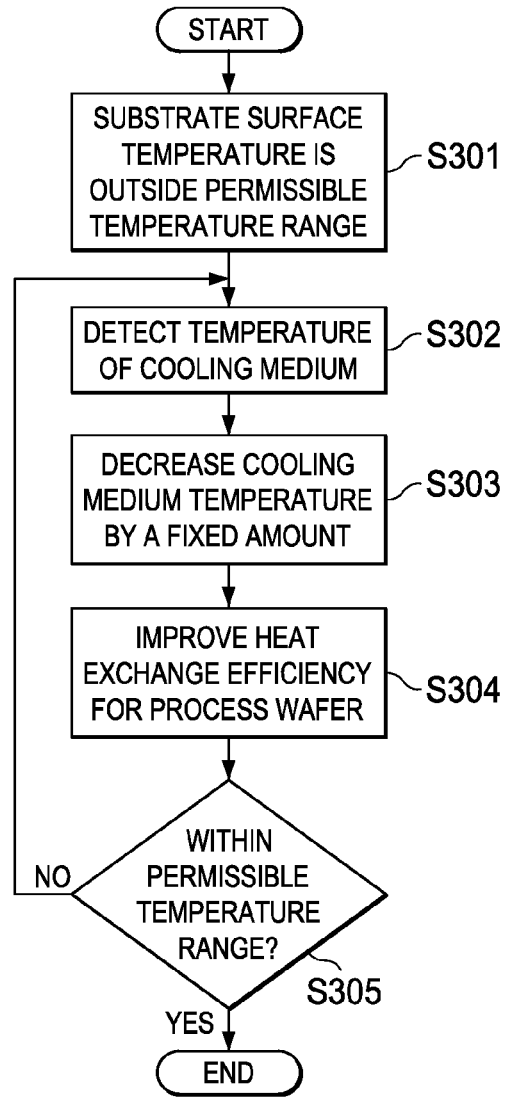
FIG. 10 is a diagram showing the process flow of an ion implantation device according to a third embodiment of the present invention.

In the FIG. 10 represents an ion implantation device, 112 represents a disk, 114 represents a rotary shaft, 116 represents a positioning mark, 118 represents a cover, 118A represents a through-hole, 119 represents a chamber, 122 represents an infrared sensor, P represents a measurement region, V represents a vertical scan, W represents a wafer

DESCRIPTION OF THE EMBODIMENTS

By means of the present invention an ion implantation device can be provided that monitors and corrects the temperature of the substrate in real time. Therefore, variation in the manufacture of semiconductor devices can be reduced and the yield rate can be improved.

In the following an embodiment of the present invention will be explained in detail with reference to the figures. However, the shape and the scale of the components recorded in the figures have been emphasized to facilitate an understanding of the invention, and it should be noted that they do not necessarily match those of an actual product.

Figure 1A:
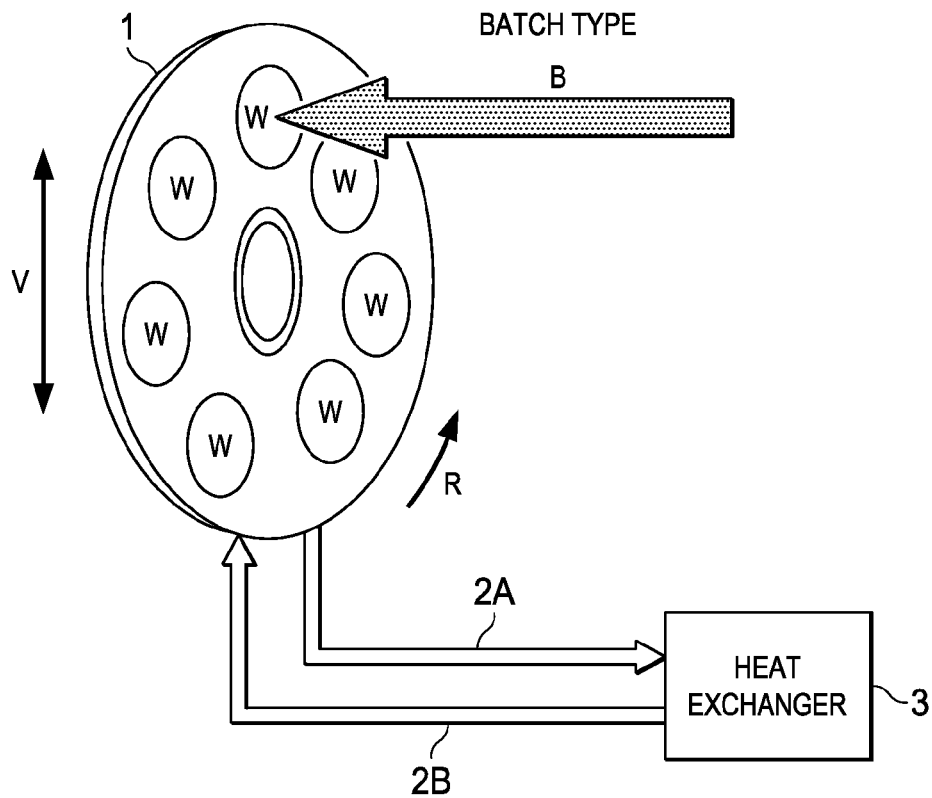
Figure 1B:
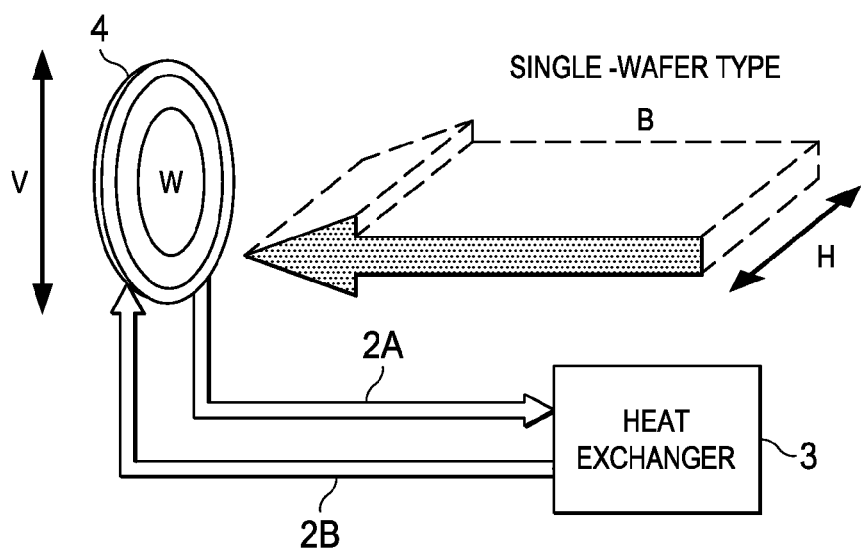
FIG. 1(b) shows an overview of a single-substrate type of ion implantation device.
Figure 2:
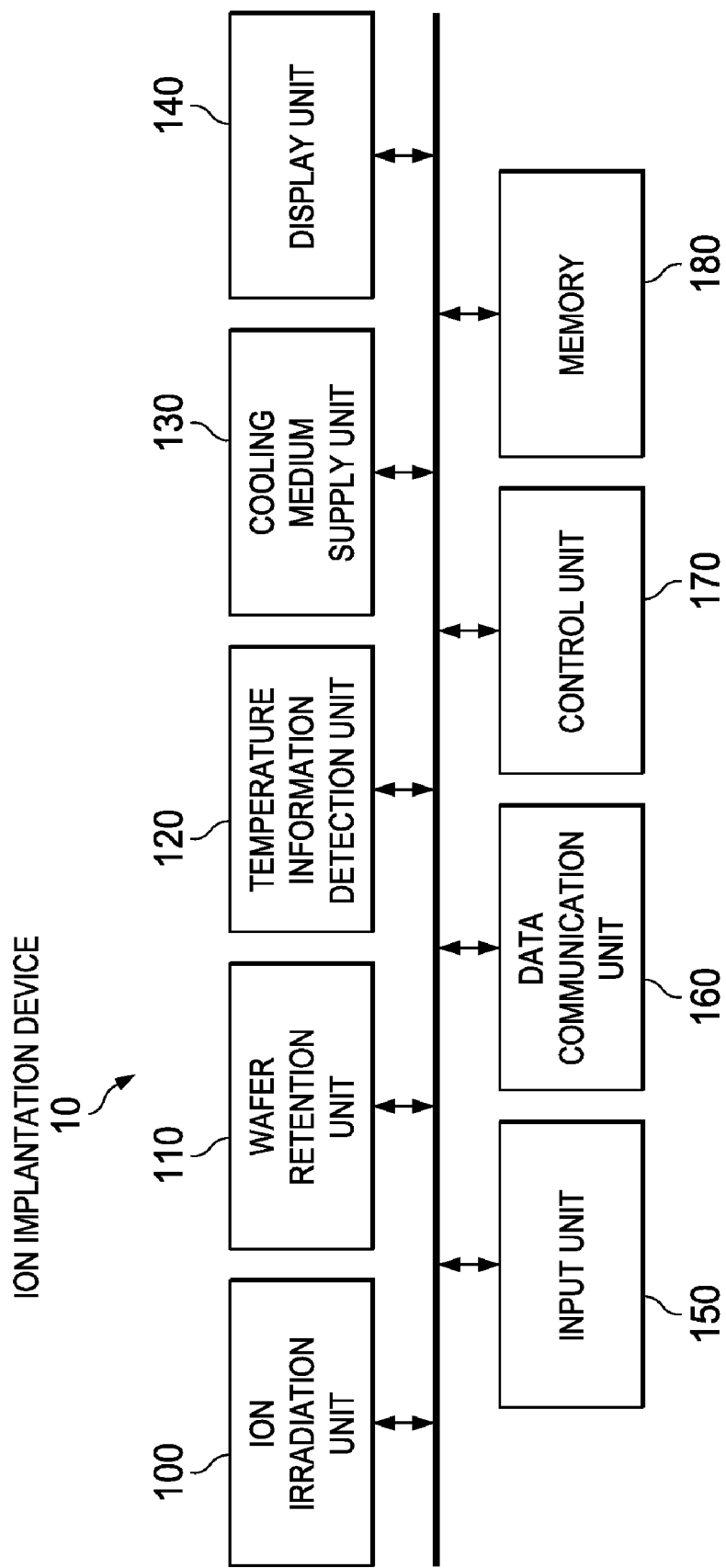
FIG. 2 is a block diagram showing the overall configuration of an ion implantation device according to an embodiment of the present invention.

FIG. 2 is a schematic block diagram showing the configuration of an ion implantation device according to an embodiment of the present invention. As shown in FIG. 2, an ion implantation device 10 according to the present embodiment is configured to include: an ion irradiation unit 100 that irradiates a semiconductor wafer with ions; a wafer retention unit 110 that retains a semiconductor wafer; a temperature information detection unit 120 that detects temperature information for a semiconductor wafer retained by the wafer retention unit; a cooling medium supply unit 130 that supplies to wafer retention unit 110 a cooling medium, such as cooling water or a cooling gas, that enables heat exchange for the semiconductor wafer retained by wafer retention unit 110; a display unit 140 that displays various information; an input unit 150 that receives input from an operator; a data communication unit 160 that transmits and receives data using an external electronic device, external server, etc., in a wired or wireless manner; a control unit 170 that controls each unit; and a memory 180 that stores programs for execution by control unit 170, as well as other information.

As is publicly known, ion irradiation unit 100 includes an ion source that generates ions to be implanted, an acceleration unit that accelerates the ions generated by the ion source, a deflection plate that deflects the accelerated ions, etc.

Wafer retention unit 110 includes a disk for batch processing on which are formed pedestals that respectively retain multiple wafers, or a platen for single-wafer use. The following explanation will discuss batch processing. As shown in FIG. 3(a), a disk 112 is circular in shape and comprises electroconductive material, and can retain multiple semiconductor wafers W arranged circumferentially. Each pedestal is provided with a mechanism for clamping the edge of a semiconductor wafer W. The rotary shaft 114 of disk 112 is rotated by a motor not shown in the figure, and disk 112 can be moved in the vertical direction V. In addition, a positioning mark 116 is formed on the surface of disk 112, and positioning mark 116 is detected by a position detection sensor not shown in the figure. Thus, control unit 170 can identify the rotational angle of the wafer and the pedestal positions.

Preferably, temperature information detection unit 120 measures the temperature of the wafer W retained on disk 112 in a noncontact manner. In the present embodiment an infrared sensor (thermopile) is used to measure heat radiated from the wafer. Generally, it is difficult to measure the temperature of a silicon wafer with a radiation thermometer, the primary reason being that many of the radiation wavelengths of the temperature measurement region pass through silicon, Consequently, the wafer is in a semi-translucent state with respect to the radiation measurement device, which ends up measuring extraneous energy other than that of the object to be measured. Furthermore, factors other than transmissivity which affect the measurement of the wafer temperature include emissivity, the visual field of measurement, responsiveness, resolution, etc. If a specific factor evaluation is preformed however, since many factors are stable, it can be said to be a suitable measurement environment. With regard to the transmissivity of silicon, the temperature of the back side is stable, and if the total energy can be determined then it is possible to determine the wafer temperature. For these reasons, the present embodiment utilizes a thermopile module used with a typical radiation measurement device.

Figure 3B:
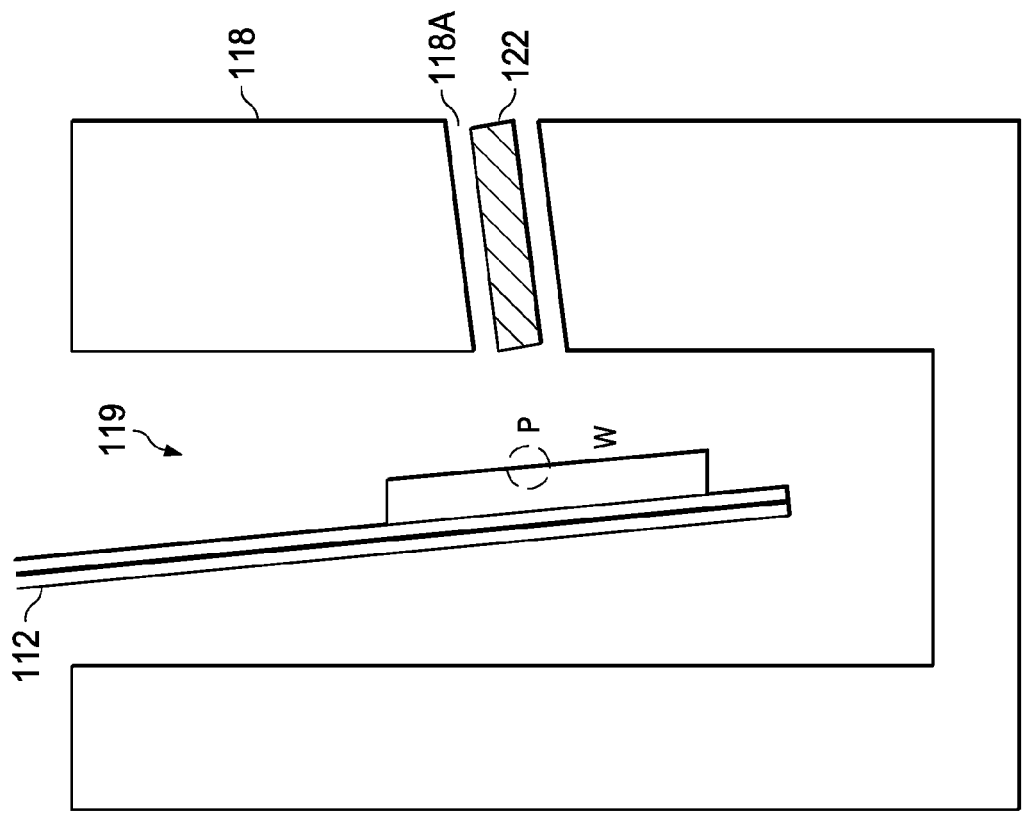
FIG. 3(b) an approximate cross section showing the relationship between the thermopile (infrared sensor) and the wafer on the disk.
Figure 3A:
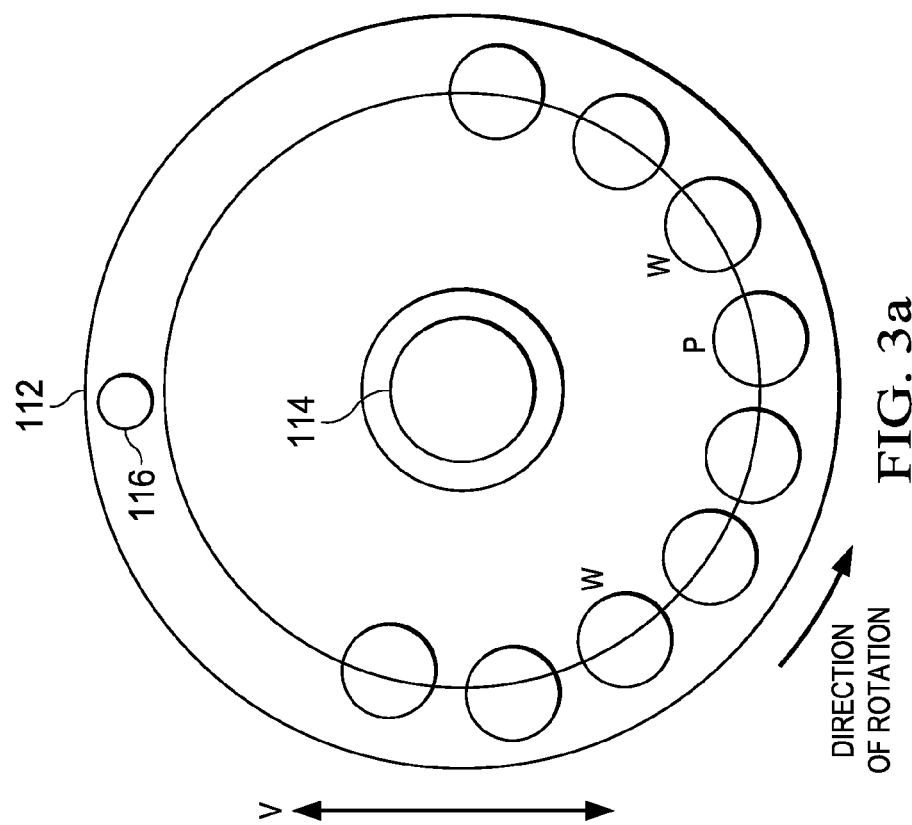

As shown in FIG. 3(b), a U-shaped cover 118 is mounted such that it faces the edge portion of the rotating disk 112. Cover 118 forms a chamber 119 in which disk 112 can be arranged. A small, cylindrical through-hole 118A is formed in a portion of cover 118 and a thermopile 122 is arranged in said though-hole 118A. The environment which includes disk 112 within chamber 119 and cover 118 is preferably a vacuum. As shown in FIG. 3(a), thermopile 122 measures a measurement region P of each wafer W on the circumference, but because through-hole 118A has a small radius and the distance between thermopile 122 and the wafers W is small, the field of view of thermopile 122 is small, so that the effect due to the measurement field of view can be limited. When disk 112 rotates, thermopile 122 measures the heat energy radiated by the wafers W placed on disk 112 and produces an electromotive force corresponding to that heat energy. Thermopile 122 is arranged within cover 118 such that the surfaces of the wafers W are parallel to the surface of thermopile 122.

Furthermore, with the present embodiment a thermo label is used to obtain the relationship between the thermopile's output voltage and the substrate surface temperature of a wafer W. A thermo label exhibits a change in color when it reaches a specific temperature, and the change in color that occurs when it reaches that specific temperature is irreversible. With a thermo label the temperature can be viewed or checked in step widths of from 1 to 5 degrees. The thermo label cannot be attached to the actual product (wafer W); instead, as will be explained later, it is attached to a dummy wafer and the dummy wafer is used to determine the relationship between the thermopile's output voltage and the substrate surface temperature.

Cooling medium supply unit 130 supplies cooling water or cooling gas to disk 112; for example, cooling medium supply unit 130 supplies the cooling medium to disk 112 via a pipe and collects the heat-exchanged cooling medium from disk 112 via a pipe. Cooling medium supply unit 130 can include a temperature sensor that detects the temperature of the cooling medium, a supply valve for adjusting the amount of cooling medium supplied, and a heat exchanger that adjusts the temperature of the cooling medium. Cooling medium supply unit 130 can adjust the temperature of the cooling medium and the amount of cooling medium supplied in response to commands from control unit 170.

Display unit 140 includes a display and, for example, displays the substrate surface temperature of a semiconductor wafer in real time and displays information such as the process conditions for execution of ion implantation, the permissible substrate temperature for execution of ion implantation, and the characteristics of the semiconductor device being manufactured by ion implantation. Input unit 150 receives various information from an operator and transmits this to control unit 170. The operator can, for example, specify the beginning and end of ion implantation, and cans search for and select process conditions stored in memory 180.

Data communication unit 160 can exchange data with other semiconductor manufacturing equipment and computer devices, and can exchange data with a server which manages the manufacturing process. For example, the ion implantation device can obtain process conditions from the server, with said process conditions including information such as the type of ions to be implanted, the ion beam power, and the permissible range of substrate surface temperature for ion implantation. Control unit 170 can control ion irradiation unit 100 in response to the received process conditions.

Control unit 170 includes a device such as a central processing unit, microcomputer or arithmetic processor, and controls the various units. Memory 180 stores information required for execution of ion implantation, programs executed by control unit 170, etc. This information is prepared in advance or is received from the outside via data communication unit 160. Memory 180 stores, for example, the process conditions (including ion implantation conditions and the permissible wafer temperature during ion implantation) on a device-by-device basis, including information such as the formula for calculating the substrate surface temperature based on the temperature information detected by temperature information detection unit 120.

Figure 4B:
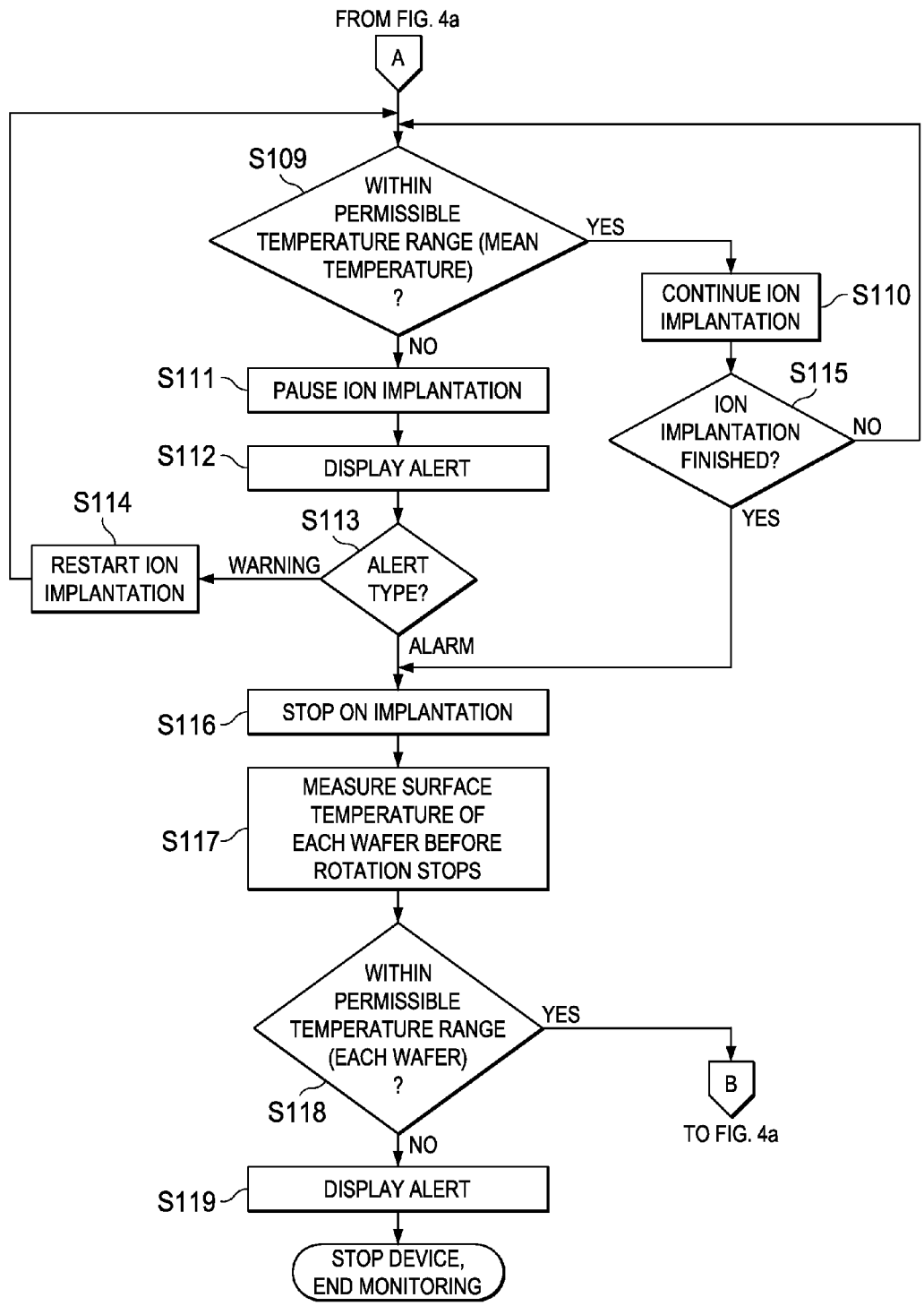
FIG. 4B is a diagram showing the process flow of an ion implantation device according to the first embodiment of the present invention.

Next, the operation of the ion implantation device according to the present embodiment will be explained with reference to the flow charts in FIGS. 4A and 4B. First, a dummy wafer is placed on a pedestal of disk 112 (step S101). The number of dummy wafers used does not necessarily have to be more than one. In addition, a thermo label which changes color when a specific temperature is attained is attached to the surface of the mounted dummy wafer. When multiple dummy wafers are mounted a thermo label can be attached to each dummy wafer.

Next, control unit 170 rotates disk 112 at a fixed rotational velocity and the dummy wafer is subjected to ion implantation under actual process conditions (step S102). Control unit 170 reads the process conditions from memory 180 and controls the irradiation for the purpose of ion implantation by controlling the type of ion for ion irradiation unit 100, the ion beam power, etc.

Next, temperature information detection unit 120 detects the dummy wafer temperature information—that is, the voltage generated in response to the radiant heat—in two stages and transmits the information to control unit 170 (step S103). First, temperature information detection unit 120 detects the mean temperature information for all dummy wafers on disk 112 being rotated at high speed in chamber 119 while ion implantation is being performed on the dummy wafers. In other words, the temperature within the batch is detected by thermopile 122. Next, ion implantation is stopped or paused, the rotational velocity of disk 112 is reduced, and when it becomes possible to detect individual dummy wafer temperature information, the temperature information for each dummy wafer is detected. Thus the two sets of information—the mean temperature information within the batch and the individual temperature information for the dummy wafers—are respectively stored in memory 180.

Figure 6:
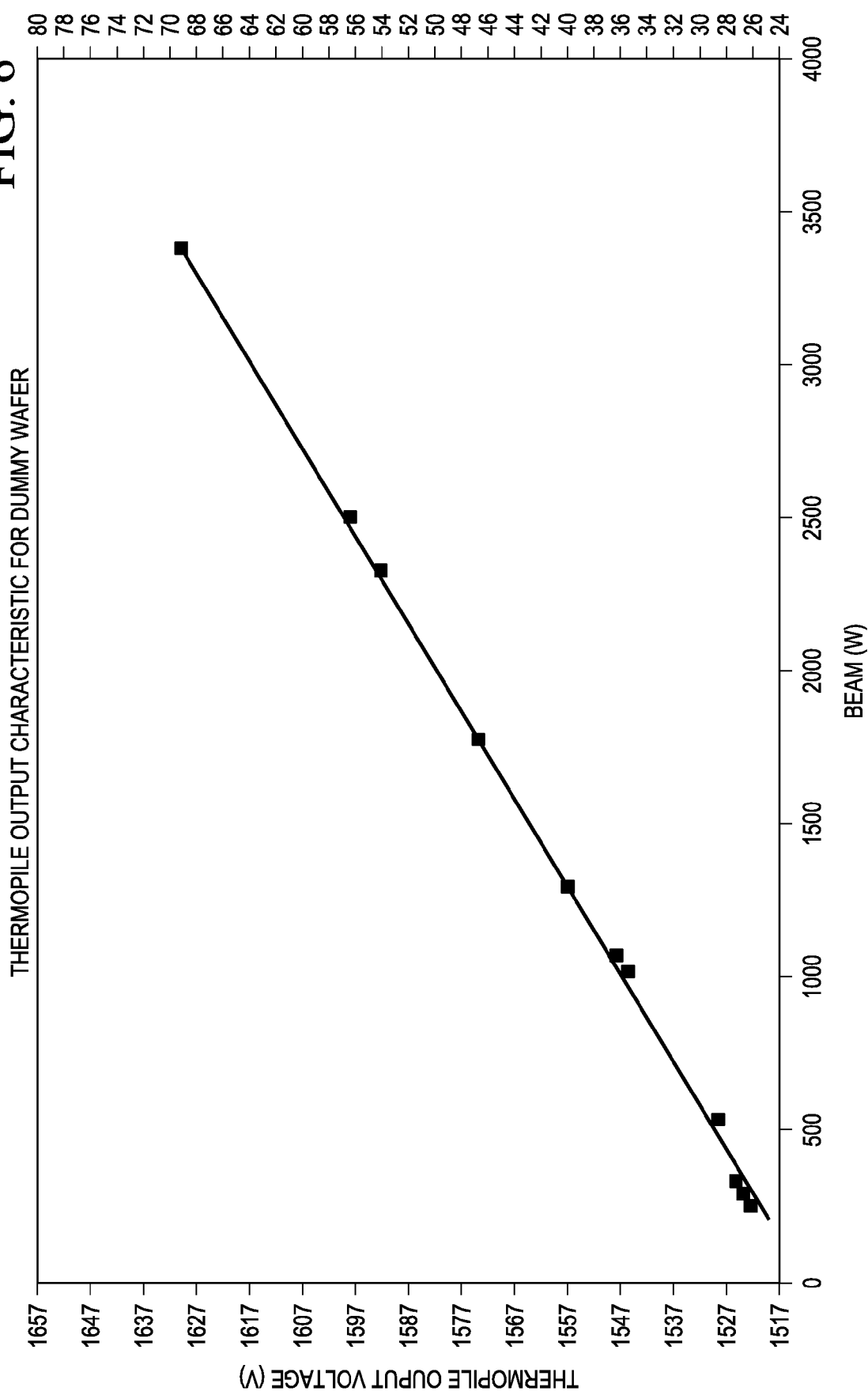
FIG. 6 is a graph from the sample values shown in FIG. 5 showing the output characteristic of the thermopile based on the emissivity of a dummy wafer.

On the other hand, the operator observes the substrate surface temperature from the thermo label attached to the surface of the dummy wafer. This observation is performed when the disk is rotating at high speed—in other words, during detection of mean temperature information for the batch—and when the disk's rotational velocity is reduced and temperature information is detected for each dummy wafer in the batch. Sampling of the information using dummy wafers is performed under multiple process conditions, and the information for each situation, such as the ion beam power, thermopile output voltage and the substrate surface temperature, are extracted. FIG. 5 is a table showing the relationship between the beam power (W), the thermopile output voltage (V), and the thermo label's substrate surface temperature (° C.) for sampling under multiple process conditions. FIG. 6 is a graph showing the relationship between the beam power, thermopile output voltage, and substrate surface temperature from the table of FIG. 5; the left vertical axis is the thermopile output voltage (V), the right vertical axis is the thermo label substrate surface temperature, and the horizontal axis is the beam power. The line shape obtained shows how the thermopile output voltage and the substrate surface temperature increase as the beam power increases. The correlation shown in FIG. 6 is created based on the mean temperature information within the batch and the individual temperature information for the dummy wafers.

The substrate surface temperature observed by means of the thermo label is input by the operator at input unit 150, and control unit 170 can determine the correlation of the line shape shown in FIG. 6 based on the sample information by means of a prepared program, storing this in memory 180 (step S105).

Next, the dummy wafers are removed from the disk and multiple process wafers are mounted (step S106). Control unit 170 rotates disk 112 at a fixed rotational velocity and controls ion irradiation unit 100 to perform ion implantation for the process wafers under actual process conditions (step S107). Just as with the dummy wafers, temperature information detection unit 120 detects the temperature information for the process wafers in two stages, outputting the information to control unit 170. First, temperature information detection unit 120 detects the mean temperature information for all process wafers on disk 112 being rotated at high speed in chamber 119 while ion implantation is performed. In other words, the temperature within the batch is detected by thermopile 122. Next, ion implantation is stopped or paused, the rotational velocity of disk 112 is reduced, and when it becomes possible to detect the individual process wafer temperature information, the temperature information for each process wafer is detected. Control unit 170 calculates substrate surface temperature information for the process wafers from the 2 output voltages for the process wafers—that is, the mean thermopile output voltage and the individual thermopile output voltage—and from the correlation obtained when the dummy wafers were sampled (step S108).

FIG. 7 is a graph showing the relationship between the thermopile output voltage for process wafers and the calculated substrate surface temperature. A resist pattern and the like are formed on the surface of an actual process wafer, so that emissivity differs from that of a dummy wafer; in other words, with identical process conditions the thermopile output voltage detected with a process wafer differs from the thermopile output voltage detected with a dummy wafer. Therefore, a correlation is calculated wherein the corresponding substrate surface temperature has been sampled for the detected thermopile output voltage of the process wafer.

Control unit 170 determines whether the mean temperature for each process wafer—that is, the temperature within the batch—is within the permissible temperature range for the corresponding process and the semiconductor devices manufactured with said process (step S109). Ion implantation continues (step S110) when the substrate surface temperature is within the permissible range. However, if the substrate surface temperature is outside of the permissible temperature range control unit 170 stops the operation of ion irradiation unit 100, pauses ion implantation (step S111), and displays an alert on display unit 140 indicating that a wafer temperature error has occurred (step S112). This alert is either a 'Warning' from which ion implantation is restarted or an 'Alarm' which cancels ion implantation. The difference between a 'Warning' and an 'Alarm', for example, can be set with a given temperature (60° C.) serving as the boundary, with anything at or above that being an 'Alarm' and anything below that being a 'Warning'. In addition, the alert can be audible.

When the alert is a 'Warning' the operator restarts ion implantation (S114) and the process returns to step S109. On the other hand, when the alert is an 'Alarm', ion implantation is stopped (S116). In addition, when ion implantation continues (S110), a determination is made regarding whether the specified ion implantation has been completed (S115); if it has not been completed the process returns to step S109, and if it has been completed, ion implantation is stopped (S116).

When the ion implantation process is complete (step S116) the rotation of disk 112 is slowed enough to allow individual wafers to be identified, and the surface temperature is measured separately for each wafer while disk 112 is rotating (step S117). Then a determination is made regarding whether the surface temperature for each process wafer is within the permissible temperature range (step S118). If the surface temperature is within the permissible temperature range a new process wafer is mounted on disk 112 and the process repeats from step S106. On the other hand, if the surface temperature is not within the permissible temperature range an alert indicating that a wafer temperature error has occurred is displayed on display unit 140 (step S119), the device is stopped, and monitoring is complete.

Preferably, control unit 170 detects positioning mark 116 on disk 112 with a position detection sensor during the aforementioned step S118 to identify which process wafer has a temperature error. This can be identified based on the time at which positioning mark 116 is detected and the angle between positioning mark 116 and each pedestal. The wafer temperature can thus be monitored on a per-wafer basis even for a batch. Furthermore, it is preferable that display unit 140 display the substrate surface temperature on a per-wafer basis in real time, with the operator confirming the wafer temperature. On the other hand, for a batch, the mean temperature within the batch can be monitored and corrected.

By means of the present embodiment, it is possible when ion implantation is performed to correct the wafer temperature to a permissible temperature, so that variation in the characteristics of elements and circuits formed on the wafer can be limited and devices can be manufactured within the design margin.

In particular, with a high-current ion implantation process it is well known that the wafer temperature has a significant effect on the amplification characteristic of the transistor (the HFE parameter). This is thought to be caused by an insufficient exchange of heat, which causes the wafer temperature to rise and increases crystal defects, thus hindering diffusion. In other words, the wafer temperature during processing is a critical factor not only with respect to product defects, but also with respect to variability in product quality. FIG. 8 is a diagram showing the relationship between wafer temperature and the HFE characteristic; the vertical axis is the amplification characteristic and the horizontal axis is the wafer temperature at the time of ion implantation. In this example, when the wafer temperature exceeds 60° C. a large variation in the HFE parameter begins to occur. Conversely, if the wafer temperature is too low (for example, 45° C.) the yield rate decreases. As with the current embodiment, correcting the wafer temperature within a permissible temperature range during ion implantation makes it possible to limit variability in the amplification characteristic of the transistor.

Figure 9:
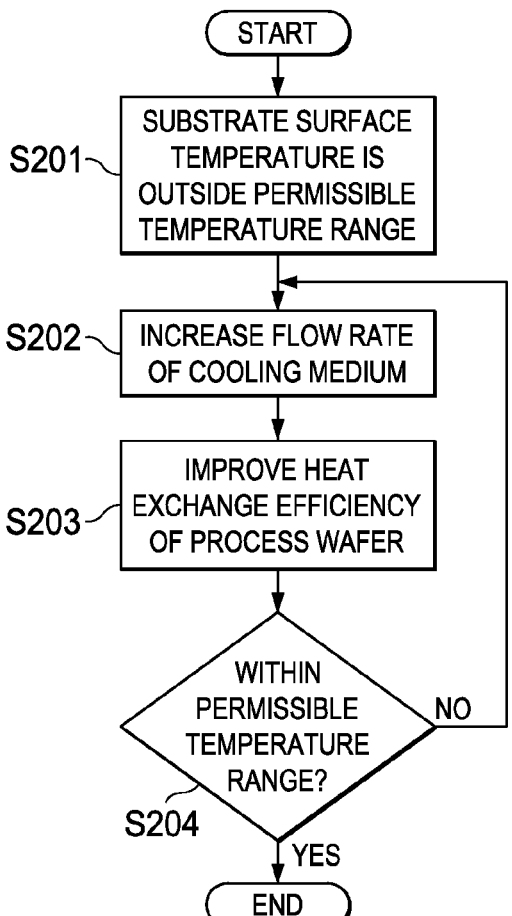
FIG. 9 is a diagram showing the process flow of an ion implantation device according to a second embodiment of the present invention.

Next, a second embodiment of the present invention will be explained with reference to the flow chart in FIG. 9. In the aforementioned embodiment, ion implantation is automatically stopped when the substrate surface temperature of the process wafer is outside of a permissible temperature range; however, in the second embodiment the substrate surface temperature is controlled such that it is within a permissible temperature range.

First, control unit 170 determines whether the substrate surface temperature is outside of a permissible temperature range (step S201) and controls cooling medium supply unit 130 to increase the supply of cooling medium by a fixed amount (step S202). Cooling of disk 112 thus is promoted and the process wafer heat exchange efficiency is improved (step S203).

Control unit 170 monitors the substrate surface temperature of process wafers based on temperature information from temperature information detection unit 120, and determines whether said temperature is within a permissible temperature range (step S204). If it is outside of the permissible temperature range, the flow rate of the cooling medium is further increased in the aforementioned step S202, and the heat exchange efficiency can be further improved. By means of the second embodiment the substrate surface temperature of the process wafer is corrected within a permissible range, enabling ion implantation to be performed continuously. A decrease in throughput can thus be prevented. In the case of the second embodiment, it is preferable that the permissible temperature be set such that it includes more of a margin than that of the first embodiment.

Next, a third embodiment of the present invention will be explained with reference to the flow chart in FIG. 10. The second embodiment illustrated an example in which the flow rate of the cooling medium was adjusted, but here the temperature of the cooling medium is controlled. Control unit 170 determines whether the substrate surface temperature is outside of the permissible temperature range (step S301) and controls cooling medium supply unit 130, lowering the temperature of the cooling medium. Preferably the temperature of the cooling medium is detected with cooling medium supply unit 130 (step S302); next, the temperature of the cooling medium is lowered by a fixed amount (step S303) by means of a heat exchanger with which cooling medium supply unit 130 is provided. Cooling of the disk is thus promoted, and the heat exchange efficiency of the process wafer is improved (step S304).

Control unit 170 monitors the substrate surface temperature of process wafers based on temperature information from temperature information detection unit 120 and determines whether the substrate surface temperature is within the permissible temperature range (step S305). If it is outside of the permissible temperature range, the temperature of the cooling medium is lowered by means of the aforementioned step S303, further improving heat exchange efficiency. In addition, control can be performed by combining the third embodiment and the second embodiment.

The aforementioned embodiments involved a batch process ion implantation device, but the present invention can also be applied to a single-wafer ion implantation device. For the batch type a thermopile was used as a noncontact temperature detection means, but if the platen which retains the wafer in the single-wafer type does not rotate, the temperature detection means can be mounted on the platen itself. Furthermore, in the aforementioned embodiments, the examples for the batch type illustrated control involving detection of mean temperature information for dummy wafers and process wafers within a batch, but for the single-wafer type a thermopile (sensor) can track temperature information even during ion implantation, so it is not necessary to average the temperature within chamber 119. Accordingly, for the single wafer type it is possible to monitor the substrate surface temperature for the process wafer during ion implantation and to pause or stop ion implantation, or to control the cooling temperature of the process wafer in response to the detected temperature.

Furthermore, the wafer retention method for the batch type or single-wafer type can use an electrostatic chuck or another adhesion method in addition to a mechanical clamp. Furthermore, the thermopile used to measure the radiant heat of the wafer was arranged in a vacuum environment, but instead of being in a vacuum the measurement can be performed from the outside through a special glass.

The aforementioned embodiments illustrated an example whereby a dummy wafer is used to sample the relationship between the output voltage of a thermopile and the substrate surface temperature but when the relationship there-between (for example, a correlation such as that shown in FIG. 6) is already known, sampling of a dummy wafer is not always required if said correlation is stored in memory 180.

For both the batch type and the single-wafer type it is possible to determine the temperature during processing by creating monitoring timing. For example, the ion implantation process includes cycles of ion implantation start, ion implantation hold, ion implantation start, and ion implantation end, and it is possible to determine the wafer temperature within these cycles.

In the above a preferred embodiment of the present invention was described, but the present invention is not limited to a specific embodiment. Various modifications and changes are possible without departing from the scope of the invention recorded in the claims.

The invention claimed is:

1. An ion implantation device that implants ions in a substrate,
   wherein the ion implantation device has:
   a chamber including a cover having a small cylindrical through-hole;
   an irradiation means that radiates ions;
   a retention means that retains at least one substrate;
   a detection means that detects, in a noncontact state, temperature information pertaining to the temperature of a substrate retained by the aforementioned retention means, wherein the detection means comprises a thermopile located in said small cylindrical through-hole;

a supply means that supplies a cooling medium to the aforementioned retention means to enable heat exchange for the substrate retained by the aforementioned retention means;

and a control means that calculates the surface temperature of the substrate retained by the aforementioned retention means based on the temperature information detected by the aforementioned detection means and determines whether the calculated substrate surface temperature is within a permissible temperature range.

2. The ion implantation device recorded in claim 1, wherein the aforementioned control means halts the radiation of ions by the aforementioned irradiation means when it is determined that the aforementioned calculated substrate surface temperature is outside of the aforementioned permissible temperature range.

3. The ion implantation device recorded in claim 1, wherein the aforementioned permissible temperature range is a temperature range permitted with the ion implantation process and the aforementioned control means records information related to the permissible temperature range in a memory.

4. The ion implantation device recorded in claim 1, wherein the aforementioned control means controls the aforementioned supply means based on the aforementioned calculated substrate surface temperature.

5. The ion implantation device recorded in claim 4, wherein the aforementioned control means controls at least one of: the temperature of the cooling medium or the amount of cooling medium supplied by the aforementioned supply means.

6. The ion implantation device recorded in claim 1, wherein the aforementioned control means records in a memory a correlation between the temperature information for a dummy silicon substrate and the surface temperature thereof, and the aforementioned control means calculates the surface temperature of a process silicon substrate based on the temperature information for the process silicon substrate and the aforementioned correlation.

7. The ion implantation device recorded in claim 6, wherein the aforementioned detection means includes an infrared sensor and the aforementioned temperature information is a voltage generated by the aforementioned infrared sensor according to the heat radiated from the substrate.

8. The ion implantation device recorded in claim 6, wherein the surface temperature of the dummy silicon substrate included in the aforementioned correlation is a value observed on a thermo label attached to the surface of a dummy silicon substrate.

9. The ion implantation device recorded in claim 1, wherein the aforementioned retention means includes a rotatable disk that retains multiple substrates and is used for batch processing, and the aforementioned disk exchanges heat by means of a cooling medium supplied by the aforementioned supply means.

10. The ion implantation device recorded in claim 1, wherein the aforementioned retention means includes a retention member that retains one substrate and is used for single-substrate processing, and the aforementioned retention member exchanges heat by means of a cooling medium supplied by the aforementioned supply means.

11. An ion implantation device that implants ions in a substrate, wherein the ion implantation device has:

a chamber including a cover having a small cylindrical through-hole;

an irradiation unit that radiates ions;

a retainer that retains at least one substrate;

a sensor that detects, in a noncontact state, temperature information pertaining to the temperature of the at least one substrate retained by the retainer, wherein the sensor comprises a thermopile located in said small cylindrical through-hole;

a cooling medium supply unit that supplies a cooling medium to the retainer to enable heat exchange for the substrate;

and a control unit that calculates the surface temperature of the at least one substrate based on the temperature information detected by the sensor and determines whether the calculated substrate surface temperature is within a permissible temperature range.

12. The ion implantation device recorded in claim 11, wherein the control unit halts the radiation of ions by the irradiation unit when it is determined that the calculated substrate surface temperature is outside of the permissible temperature range.

13. The ion implantation device recorded in claim 11, wherein the permissible temperature range is a temperature range permitted with the ion implantation process and the control unit records information related to the permissible temperature range in a memory.

14. The ion implantation device recorded in claim 11, wherein the control unit controls the cooling medium supply unit based on the calculated substrate surface temperature.

15. The ion implantation device recorded in claim 14, wherein the control unit controls at least one of: the temperature of the cooling medium or the amount of cooling medium supplied by the cooling medium supply unit.

16. The ion implantation device recorded in claim 14, wherein the control unit records in a memory a correlation between the temperature information for a dummy silicon substrate and the surface temperature thereof, and the control unit calculates the surface temperature of a process silicon substrate based on the temperature information for the process silicon substrate and said correlation.

17. The ion implantation device recorded in claim 16, wherein the sensor an infrared sensor and the aforementioned temperature information is a voltage generated by the infrared sensor according to the heat radiated from the substrate.

18. The ion implantation device recorded in claim 17, wherein the surface temperature of the dummy silicon substrate included in the correlation is a value observed on a thermo label attached to the surface of a dummy silicon substrate.

19. The ion implantation device recorded in claim 18, wherein the retainer includes a rotatable disk that retains multiple substrates and is used for batch processing, and the disk exchanges heat by means of a cooling medium supplied by the cooling medium supply unit.

20. The ion implantation device recorded in claim 19, wherein the retainer includes a retention member that retains one substrate and is used for single-substrate processing, and the retention member exchanges heat by means of a cooling medium supplied by the cooling medium supply unit.

* * * * *